(12) United States Patent
Onose et al.

(10) Patent No.: US 10,429,746 B2
(45) Date of Patent: Oct. 1, 2019

(54) ESTIMATION OF DATA IN METROLOGY

(71) Applicant: ASML NETHERLANDS B.V., Veldhoven (NL)

(72) Inventors: Alexandru Onose, Eindhoven (NL);
Seyed Iman Mossavat, Waalre (NL);
Thomas Theeuwes, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/163,751

(22) Filed: Oct. 18, 2018

(65) Prior Publication Data
US 2019/0129313 A1    May 2, 2019

(30) Foreign Application Priority Data

Nov. 1, 2017 (EP) .................................... 17199539

(51) Int. Cl.
*G03F 7/20* (2006.01)
(52) U.S. Cl.
CPC .......... *G03F 7/70508* (2013.01); *G03F 7/705* (2013.01); *G03F 7/70608* (2013.01); *G03F 7/70633* (2013.01); *G03F 7/70666* (2013.01)
(58) Field of Classification Search
CPC ............ G03F 7/70508; G03F 7/70608; G03F 7/70666; G03F 7/70491; G03F 7/705
See application file for complete search history.

(56) References Cited

U.S. PATENT DOCUMENTS

| 5,229,872 A | 7/1993 | Mumola |
| 5,296,891 A | 3/1994 | Vogt et al. |
| 5,523,193 A | 6/1996 | Nelson |
| (Continued) | | |

FOREIGN PATENT DOCUMENTS

| EP | 1628164 A2 | 2/2006 |
| EP | 2515168 A2 | 10/2012 |
| (Continued) | | |

OTHER PUBLICATIONS

Donoho, David L., et al.: "Optimally sparse representation in general (nonorthogonal) dictionaries via L1 minimization", PNAS, vol. 100, No. 5, Mar. 4, 2003, pp. 2197-2202.
(Continued)

*Primary Examiner* — Steven Whitesell Gordon
(74) *Attorney, Agent, or Firm* — Pillsbury Winthrop Shaw Pittman LLP

(57) ABSTRACT

Methods and apparatus for estimating an unknown value of at least one of a plurality of sets of data, each set of data including a plurality of values indicative of radiation diffracted and/or reflected and/or scattered by one or more features fabricated in or on a substrate, wherein the plurality of sets of data include at least one known value, and wherein at least one of the plurality of sets of data includes an unknown value, the apparatus including a processor to estimate the unknown value of the at least one set of data based on: the known values of the plurality of sets of data, a first condition between two or more values within a set of data of the plurality of sets of data, and a second condition between two or more values being part of different sets of data of the plurality of the sets of data.

20 Claims, 8 Drawing Sheets

(56) References Cited

U.S. PATENT DOCUMENTS

| | | | |
|---|---|---|---|
| 5,748,509 A * | 5/1998 | Fewster | G01N 23/20 378/70 |
| 6,952,253 B2 | 10/2005 | Lof et al. | |
| 2007/0296960 A1 | 12/2007 | Den Boef et al. | |
| 2008/0174784 A1* | 7/2008 | Colonna De Lega | G01B 9/02057 356/511 |
| 2008/0198380 A1 | 8/2008 | Straaijer et al. | |
| 2009/0168062 A1 | 7/2009 | Straaijer | |
| 2010/0007863 A1 | 1/2010 | Jordanoska | |
| 2010/0328655 A1 | 12/2010 | Den Boef | |
| 2011/0026032 A1 | 2/2011 | Den Boef et al. | |
| 2011/0032500 A1 | 2/2011 | Straaijer | |
| 2011/0102753 A1 | 5/2011 | Van De Kerkhof et al. | |
| 2011/0102793 A1 | 5/2011 | Straaijer | |
| 2011/0188020 A1 | 8/2011 | Den Boef | |
| 2011/0249244 A1 | 10/2011 | Leewis et al. | |
| 2012/0044470 A1 | 2/2012 | Smilde et al. | |
| 2012/0044495 A1 | 2/2012 | Straaijer | |
| 2013/0162996 A1 | 6/2013 | Straaijer et al. | |
| 2013/0308142 A1 | 11/2013 | Straaijer | |
| 2016/0161863 A1 | 6/2016 | Den Boef et al. | |
| 2016/0370717 A1 | 12/2016 | Den Boef et al. | |
| 2017/0356853 A1* | 12/2017 | Sapiens | G01N 21/9501 |

FOREIGN PATENT DOCUMENTS

| | | |
|---|---|---|
| WO | 9949504 | 9/1999 |
| WO | 2011012624 A1 | 2/2011 |
| WO | 2017147261 A1 | 8/2017 |

OTHER PUBLICATIONS

Komodakis, Nikos, et al.: "Playing with Duality", IEEE Signal Processing Magazine, Oct. 13, 2015, pp. 31-54.

Candes, Emmaneul J, et al.: An Introduction to Compressive Sampling, IEEE Signal Processing Magazine, Mar. 2008, pp. 21-30.

Bertalmio, Marcelo, et al.: "Image Inpainting", Proceedings of SIGGRAPH 2000, Jul. 2000, pp. 417-424.

International Search Report and Written Opinion issued in corresponding PCT Patent Application No. PCT/EP2018/075720, dated Dec. 17, 2018.

* cited by examiner

ESTIMATION OF DATA IN METROLOGY

The present application claims the benefit of priority of European patent application no. EP17199539, filed Nov. 1, 2017, which is incorporated herein in its entirety by reference.

FIELD

The present description relates to the estimation of data in metrology. Specifically, the description may relate to the estimation of data comprising values that are indicative of radiation diffracted and/or reflected and/or scattered by one or more features fabricated in or on a substrate, which may be a semiconductor substrate such as a wafer.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses soft X-ray or extreme ultraviolet (EUV) radiation, having a wavelength within the range 1 to 100 nm, for example, within the range from 5 to 20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC) in the design layout, or other methods generally defined as "resolution enhancement techniques" (RET). Alternatively, tight control loops for controlling a stability of the lithographic apparatus may be used to improve reproduction of the pattern at low k1.

In order for the substrates exposed by a lithographic apparatus to be exposed correctly and consistently, it is desirable to inspect substrates to measure one or more properties of patterned structures, such as overlay errors between subsequent layers, line thicknesses, critical dimensions (CD), etc. This process may be termed metrology and may be undertaken by one or more inspection apparatuses, such as a metrology tool.

In some exemplary methods and apparatuses, metrology may be undertaken "on product" meaning that metrology is undertaken using features fabricated in or on a substrate that have a function in the overall device (e.g., integrated circuit) design and, for example, contribute to the operation of the device. Such features are not therefore dedicated metrology targets.

SUMMARY

The techniques employed in such metrology techniques may involve the development of libraries of data against which measured data may be compared in order to determine one or more parameters of one or more features on or in the substrate. In some examples, these libraries may identify a plurality of expected optical responses for features exhibiting particular parameters. By comparing the measured optical response to the optical responses in the library, an estimate of the parameter(s) may be determined.

The development of these libraries can be a time consuming process as they are typically generated by simulating or estimating an optical response of a particular feature, exhibiting particular parameters when illuminated by radiation from a particular optical system, using, for example, Maxwell's equations. The libraries contribute to what may be termed a metrology "recipe" and the "Time to Recipe" (T2R) is increased by the time consuming simulation process. In addition, simulation of optical responses during measurement is increased by the time consuming simulation process. It is therefore desirable to provide more efficient methods and apparatuses for estimating data, such as an optical response, in metrology.

According to an aspect, there is provided an apparatus for estimating an unknown value of at least one of a plurality of sets of data, each set of data comprising a plurality of values indicative of radiation diffracted and/or reflected and/or scattered by one or more features fabricated in or on a substrate. The plurality of sets of data comprises at least one known value and at least one of the plurality of sets of data comprises an unknown value. The apparatus comprises a processor configured to estimate the unknown value of the at least one set of data based on: the known values of the plurality of sets of data; a first condition between two or more values within a set of data of the plurality of sets of data; and a second condition between two or more values being part of different sets of data of the plurality of the sets of data.

The first and second conditions may be imposed conditions.

Optionally, the first condition comprises a smoothness condition.

Optionally, the first condition comprises data indicating a difference in magnitude between one or more values within the set of data of the plurality of sets of data.

Optionally, the processor is configured to apply the first condition between two or more values comprising adjacent values within the set of data of the plurality of sets of data.

Optionally, the second condition comprises a correlation condition.

Optionally, the second condition comprises a correlation between corresponding values in the different sets of data of the plurality of the sets of data.

Optionally, the correlation condition further comprises a correlation between values in one of the sets of data of the plurality of sets of data.

Optionally, the first condition and/or the second condition is indicative of an information content of the plurality of sets of data.

Optionally, the processor is configured to estimate the unknown value of the at least one set of data based on a matrix completion algorithm.

Optionally, the matrix completion algorithm is based on a convex optimization technique.

Optionally, the convex optimization technique comprises one of proximal splitting and primal-dual algorithms.

Optionally, the processor is configured to estimate the unknown value of the at least one set of data based on $$\arg\min_D \|D\|_* + \gamma \sum_{i=1}^n \|d_i\|_{TV} + \iota_{\|D_M - MD\|_2^2 \leq \epsilon^2}(D)$$

wherein $d_i$ is a set of data and forms a row of a matrix D, $D_M$ is the plurality of known values, $\gamma$ is a value that assigns a weight to the smoothness condition compared to the correlation condition, $\epsilon$ is an error term in an estimation of known values in D, M is a mask identifying the plurality of known values and TV is the total variation.

Optionally, the processor is configured to estimate unknown values in one or more sets of data for each of a plurality of optical and/or feature parameters and to generate a library of sets of data that is comparable with a measured set of data obtained via a measurement performed by the sensor.

Optionally, the processor is configured to match the measured set of data with at least one of the sets of data in the library to determine at least one parameter of a lithographic process undertaken on the substrate.

Optionally, the processor is further configured to generate one or more of the known values in the at least one set of data based on one or more of: at least one parameter of an optical system configured to direct radiation towards the one or more features fabricated in or on a substrate; at least one parameter of the radiation; and at least one parameter of the one or more features fabricated in or on a substrate.

Optionally, the processor is configured to generate the one or more of the known values at locations in a set of data at which information content is above a threshold value.

Optionally, all values in one or more of the plurality of sets of data are known.

Optionally, the one or more sets of data in which all values are known relate to one or more further features fabricated in or on the or a further substrate.

Optionally, one or more of the plurality of sets of data represents a pupil image and one or more of the values represents a pixel of a pupil image.

Optionally, one or more of the pixels comprises data indicative of reflectivity or intensity.

Optionally, the apparatus further comprises a sensor configured to receive radiation diffracted and/or reflected and/or scattered by the one or more features.

According to an aspect, there is provided an inspection apparatus comprising an apparatus according to any disclosed herein.

Optionally, the inspection apparatus is a metrology apparatus.

According to an aspect, there is provided a lithographic apparatus comprising an apparatus according to any disclosed herein.

According to an aspect, there is provided a lithographic cell comprising an apparatus according to any disclosed herein.

According to an aspect, there is provided a method for estimating an unknown value of at least one of a plurality of sets of data, each set of data comprising a plurality of values indicative of radiation diffracted and/or reflected and/or scattered by one or more features fabricated in or on a substrate. The plurality of sets of data comprises at least one known value and at least one of the plurality of sets of data comprises an unknown value. The method comprises estimating, by a processor, the unknown value of the at least one set of data based on: the known values of the plurality of sets of data; a first condition between two or more values within a set of data of the plurality of sets of data; and a second condition between two or more values being part of different sets of data of the plurality of the sets of data.

Optionally, the first condition comprises a smoothness condition.

Optionally, the first condition comprises data indicating a difference in magnitude between one or more values within the set of data of the plurality of sets of data.

Optionally, the method further comprises applying the first condition between two or more values comprising adjacent values within the set of data of the plurality of sets of data.

Optionally, the second condition comprises a correlation condition.

Optionally, the second condition comprises a correlation between corresponding values in the different sets of data of the plurality of the sets of data.

Optionally, the correlation condition further comprises a correlation between values in one of the sets of data of the plurality of sets of data.

Optionally, the first condition and/or the second condition is indicative of an information content of the plurality of sets of data.

Optionally, the method further comprises estimating the unknown value of the at least one set of data based on a matrix completion algorithm.

Optionally, the matrix completion algorithm is based on a convex optimization technique.

Optionally, the convex optimization technique comprises one of proximal splitting and primal-dual algorithms.

Optionally, the method further comprises estimating the unknown value of the at least one set of data based on $$\arg\min_D \|D\|_* + \gamma \sum_{i=1}^n \|d_i\|_{TV} + \iota_{\|D_M - MD\|_2^2 \leq \epsilon^2}(D)$$

wherein $d_i$ is a set of data and forms a row of a matrix D, $D_M$ is the plurality of known values, $\gamma$ is a value that assigns a weight to the smoothness condition compared to the correlation condition, $\epsilon$ is an error term in an estimation of known values in D, M is a mask identifying the plurality of known values and TV is the total variation.

Optionally, the method further comprises estimating unknown values in one or more sets of data for each of a plurality of optical and/or feature parameters and to generate a library of sets of data that is comparable with a measured set of data obtained via a measurement performed by the sensor.

Optionally, the method further comprises estimating unknown values in one or more sets of data for each of a plurality of optical and/or feature parameters and to generate a library of sets of data that is comparable with a measured set of data obtained via a measurement performed by the sensor.

Optionally, the method further comprises matching the measured set of data with at least one of the sets of data in the library to determine at least one parameter of a lithographic process undertaken on the substrate.

Optionally, the method further comprises comprising generating one or more of the known values in the at least one set of data based on one or more of: at least one parameter of an optical system configured to direct radiation towards the one or more features fabricated in or on a substrate; at least one parameter of the radiation; and at least one parameter of the one or more features fabricated in or on a substrate.

Optionally, the method further comprises generating the one or more of the known values at locations in a set of data at which information content is above a threshold value.

Optionally, all values in one or more of the plurality of sets of data are known.

Optionally, the one or more sets of data in which all values are known relate to one or more further features fabricated in or on the or a further substrate.

Optionally, one or more of the plurality of sets of data represents a pupil image and one or more of the values represents a pixel of a pupil image.

Optionally, one or more of the pixels comprises data indicative of reflectivity or intensity.

According to an aspect, there is provided a computer program comprising instructions which, when executed on at least one processor, cause the at least one processor to control an apparatus to carry out any method disclosed herein.

According to an aspect, there is provided a carrier containing the computer program above, wherein the carrier is one of an electronic signal, optical signal, radio signal, or non-transitory computer readable storage medium.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and soft X-ray and/or EUV (extreme ultra-violet radiation, e.g. having a wavelength in the range of about 1-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. More information on such mirror arrays is given in U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Figure 1:
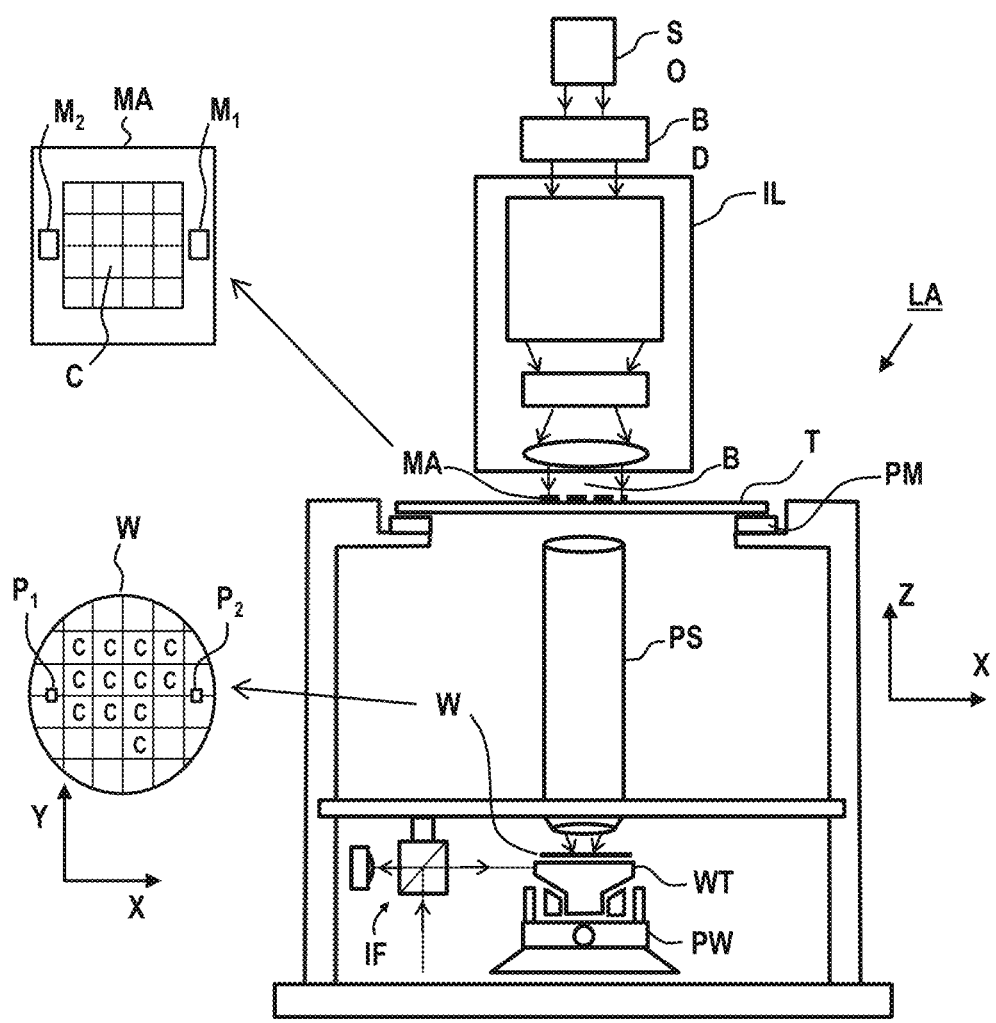
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) T constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

The lithographic apparatus LA may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT patent application publication no. WO99-49504, each of which is incorporated herein in it entirety by reference.

The lithographic apparatus LA may also be of a type having two (dual stage) or more substrate tables WT and, for example, two or more support structures T (not shown). In such "multiple stage" machines the additional tables / structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask) MA, which is held on the support structure (e.g., mask table) T, and is patterned by the patterning device MA. Having traversed the patterning device MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the patterning device MA with respect to the path of the radiation beam B. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks).

Figure 2:
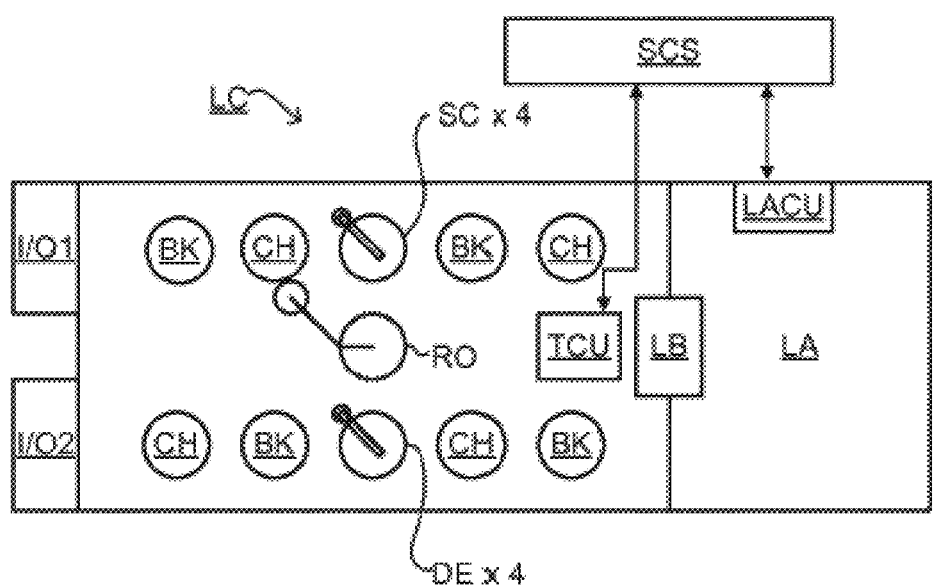
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include one or more spin coaters SC to deposit resist layers, one or more developers DE to develop exposed resist, one or more chill plates CH and/or one or more bake plates BK, e.g. for conditioning the temperature of substrates W e.g. for conditioning solvents in the resist layers. A substrate handler, or robot, RO picks up substrates W from input/output ports I/O1, I/O2, moves them between different process apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure one or more properties of patterned structures, such as values of overlay error between subsequent layers, values of line thickness, critical dimension values (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine one or more properties of the substrates W, and in particular, how one or more properties of different substrates W vary or how one or more properties associated with different layers of the same substrate W vary from layer to layer. The inspection apparatus may be constructed to identify defects on the substrate W and may, for example, be part of the lithocell LC, or may be integrated into the lithographic apparatus LA, or may even be a stand-alone device. The inspection apparatus may measure the one or more properties on a latent image (pattern in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
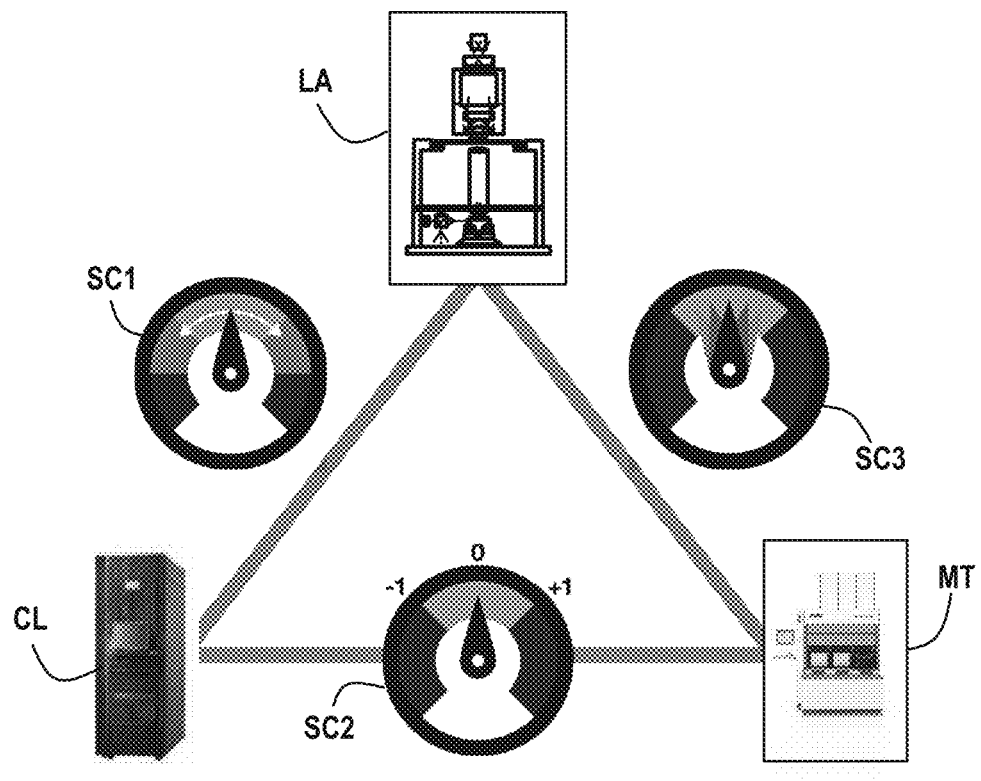
FIG. 3 depicts a schematic representation of lithography techniques, representing cooperation between three technologies to improve or optimize device manufacturing.

Typically the patterning process in a lithographic apparatus LA is a significant step in the processing and which involves high accuracy of dimensioning and placement of structures on the substrate W. To help ensure this high accuracy, three systems may be combined in a so called control environment as schematically depicted in FIG. 3. One of these systems is the lithographic apparatus LA which is (virtually) connected to a metrology tool MT (a second system) and to a computer system CL (a third system). A concept of such an environment is to improve or optimize the cooperation between these three systems to enhance, e.g., the overall process window and provide tight control loops to help ensure that the patterning performed by the lithographic apparatus LA stays within a process window. The process window defines a range of values of process parameters (e.g. dose, focus, overlay) within which a specific manufacturing process yields a defined result (e.g. a functional semiconductor device)—typically within which values of the process parameters, the lithographic process or patterning process is allowed to vary.

The computer system CL may use (part of) the design layout to be patterned to predict which one or more resolution enhancement techniques to use and to perform computational lithography simulations and calculations to determine which patterning device layout and one or more lithographic apparatus settings achieve, e.g., the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequent measurements of the structures created, e.g., for process control and verification. Tools to make such measurement are typically called metrology tools. Different types of metrology tools for making such measurements are known, including scanning electron microscopes or various forms of scatterometer metrology tools. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. patent application publication nos. US 2010-0328655, US 2011-102753, US 2012-0044470, US 2011-0249244, and US 2011-0026032 and in European patent application publication no. EP1,628,164, each of the application publications is incorporated herein by reference in its entirety. The aforementioned scatterometers may measure gratings using radiation from the soft x-ray and visible to near-IR wavelength range.

In a first embodiment, the scatterometer is an angular resolved scatterometer. In such a scatterometer, reconstruction methods may be applied to the measured signal to reconstruct or calculate one or more properties of the measured metrology target structure (e.g., a grating). Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer is a spectroscopic scatterometer MT. In a spectroscopic scatterometer, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer is an ellipsometric scatterometer. The ellipsometric scatterometer allows for determining parameters of a lithographic process by measuring scattered radiation for each of a plurality of polarization states. Such metrology apparatus emits polarized radiation (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application publication nos. US 2007-0296960, US 2008-0198380, US 2009-0168062, US 2010-0007863, US 2011-0032500, US 2011-0102793, US 2011-0188020, US 2012-0044495, US 2013-0162996 and US 2013-0308142, each of which is incorporated herein by reference in its entirety.

In one embodiment of the metrology tools, the metrology tool is adapted to measure the overlay of two misaligned gratings or periodic structures by measuring asymmetry in the reflected spectrum and/or the detection configuration, the asymmetry being related to the extent of the overlay. The two (typically overlapping) structures may be applied in two different layers (not necessarily consecutive layers), and may be formed substantially at the same position on the substrate. The metrology tool may have a symmetrical detection configuration as described e.g. in European patent application publication no. EP1,628,164, such that any asymmetry is clearly distinguishable. This provides a straightforward way to measure misalignment in periodic structures. Further examples for measuring overlay error between two layers containing periodic structures through asymmetry of the periodic structures may be found in PCT patent application publication no. WO 2011/012624 or U.S. patent application publication no. US 2016-0161863, each of which is incorporated herein by reference in its entirety.

Other parameters of interest may be focus and dose. Focus and dose may be determined simultaneously by scatterometry (or alternatively by scanning electron microscopy) as described in U.S. patent application publication no. US 2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite periodic structures (e.g., gratings), formed by a lithographic process, mostly in resist, but also, e.g., after an etch process. Typically the pitch and line-width of the structures in the periodic structures strongly depend on the measurement optics (in particular the NA of the optics) to be able to capture diffraction orders coming from the metrology target. As indicated earlier, the diffracted signal may be used to determine shifts between two layers (also referred to 'overlay') or may be used to reconstruct at least part of the original periodic structure as produced by the lithographic process. This reconstruction may be used to provide guidance of the quality of the lithographic process and may be used to control at least part of the lithographic process. A target may have smaller sub-segmentation and may be configured to mimic, in the target, dimensions of the functional part of the design layout. Due to this sub-segmentation, a target will behave more similarly to the functional part of the design layout such that the overall process parameter measurements resemble the functional part of the design layout better. A target may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target of a substrate is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application publication nos. US 2016-0161863 and US 2016-0370717, each of which is incorporated herein by reference in its entirety.

As noted, in lithographic processes, it is desirable to make frequent measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target. To speed up the reconstruction process, libraries of simulated scattered signals (or optical responses) are simulated and stored for each particular set of target parameters and/or measurement parameters leading to the simulated scattered signal. This library generation allows a fast reconstruction time by using already simulated responses.

So, the reconstruction process may include the development of libraries of simulated optical responses, under certain optical conditions, for one or more features fabricated in or on a substrate. The simulated optical responses may be determined for the features assuming they exhibit one or more lithographic parameters, such as CD, overlay, focus, dose, pitchwalk, etc. at varying degrees. Optical responses (simulated or measured) may include values representing radiation diffracted by a substrate and measured in a pupil plane or re-imaged pupil plane of an optical tool to form a pupil image. In such arrangements, the values generated in the simulated optical responses are representative of pixels of the pupil image. However, it should be understood that the methods and apparatus disclosed herein may be applied to a more general case in which the libraries comprise sets of data, each set of data being obtainable via a sensor and comprising a plurality of values indicative of radiation diffracted and/or reflected and/or scattered by one or more features fabricated in or on a substrate. The values may be reflectivity coefficients that comprise a number of (e.g. 4) complex coefficients. The reflectivity coefficients provide information that determines, given a radiation that impinges, in use of an apparatus such as those disclosed herein, on the features on a substrate and given an optical system of the apparatus through which the diffracted/reflected/scattered radiation is propagated to a sensor, measured intensities at pixels of a sensor. The description below refers to the case in which each of the sets of data applies to simulated pupil images, but this should be understood as exemplary only.

Broadly speaking, pixels of a simulated pupil image may be determined using Maxwell's equations, knowledge of the structure of the features of the substrate and/or by assuming that a particular degree of a lithographic parameter is seen in the features. This will be understood by the skilled person and is not discussed in detail here. However, full simulation of each pupil image is computationally expensive and time consuming. Therefore, there exist a number of methods for more efficiently determining the simulated pupil images and thereby generating the libraries. For example, in an approximation method, a linear approximation of pixels in a pupil image to be simulated is based on the reflectivity of a subset of principal pixels. The approximation method establishes a relationship across the pixels in the pupil and applies that relationship to the simulated pupil using the principal pixels to estimate the remaining pixels. In other words, redundancy in the pupil space is exploited such that only a small subset of pixels in a pupil to be simulated needs to be determined using Maxwell's equations and the remaining pixels may be estimated based on the principal pixels. Typically, the approximation methods are based on a large amount of full pupils to determine the relationship between pixels in a pupil image. Essentially, the methods look at a large collection of full pupil images relating to one or more stacks (as discussed further below), find the principal pixels that represent this collection of full pupil images and a relationship between the pixels in the full pupil images. The methods then check the accuracy of a determined approximation of pupil images for other stacks based on the principal pixels and the relationship. If the approximation is poor more principal pixels and stacks are added and the process is repeated.

Further improvements in the approximation method type of library generation can improve T2R (time to recipe) and thereby make library generation more efficient. In particular, exemplary methods and apparatus disclosed herein might aim to avoid or reduce the number of redundant calculations in an early phase of library generation. In some cases, this may be achieved using transfer learning, which may reuse data from similar libraries (which can potentially correspond to different features (a different stack)) to generate pupil images of a library relating to the features that are to be the subject of the metrology. It is noted that, as used herein, the term "stack" encompasses a parameterization of a geometrical structure fabricated in or on a substrate and/or a specific layer structure, which can include the one or more layers used to form the geometrical structure. Further, a "stack simulation" encompasses a model of a stack in which one or more parameters is fixed at a particular value. As part of the approximation method, a tool is "trained" by determining full pupil images based on Maxwell's equations to determine redundancy across pixels in the pupil image (i.e. within a pupil image), but as mentioned above, this is computationally expensive. Methods and apparatus disclosed herein seek to determine the redundancy within the pupil image with less computational effort. Specifically, some approximation methods use full pupils to find the redundancy whereas, in contrast, methods and apparatuses disclosed herein use knowledge that the data in the pupil image includes redundant data and use one or more characteristics of that redundancy to determine an estimation of a pupil image without the need to see all the data in any pupil image.

Exemplary methods and apparatus may be configured to estimate a plurality of unknown values in one or more sets of data based on at least one known value in the one or more sets of data, an imposed first condition between values within one of the sets of data and an imposed second condition between values in different sets of data. In specific examples, the sets of data may represent pupil images and the known and unknown values may represent known and unknown pixel values. In the specific examples discussed herein, the first condition may be the smoothness between pixel values within a pupil image and/or the second condition may be a correlation between pixel values in different pupil images. Exemplary methods and apparatus may "fill-in" gaps in the pixel image data by leveraging assumptions on the correlation (which is indicative of a redundancy in the pupil images) and the smoothness in the pixel image data. Such methods may be applied to the problem of generating libraries of simulated pixel images. Numerical results show that methods and apparatuses disclosed herein achieve an accuracy in mean-squared-error (MSE) that is superior by an order of magnitude when compared to the techniques discussed in one of the previous paragraphs with only 10% of the data in the pupil image used as training data. It is noted that the required training data is the amount of data that must be generated by the Maxwell solver to be able to determine the relations (or first and second conditions) between the pixels in the pupil images.

Figure 4:
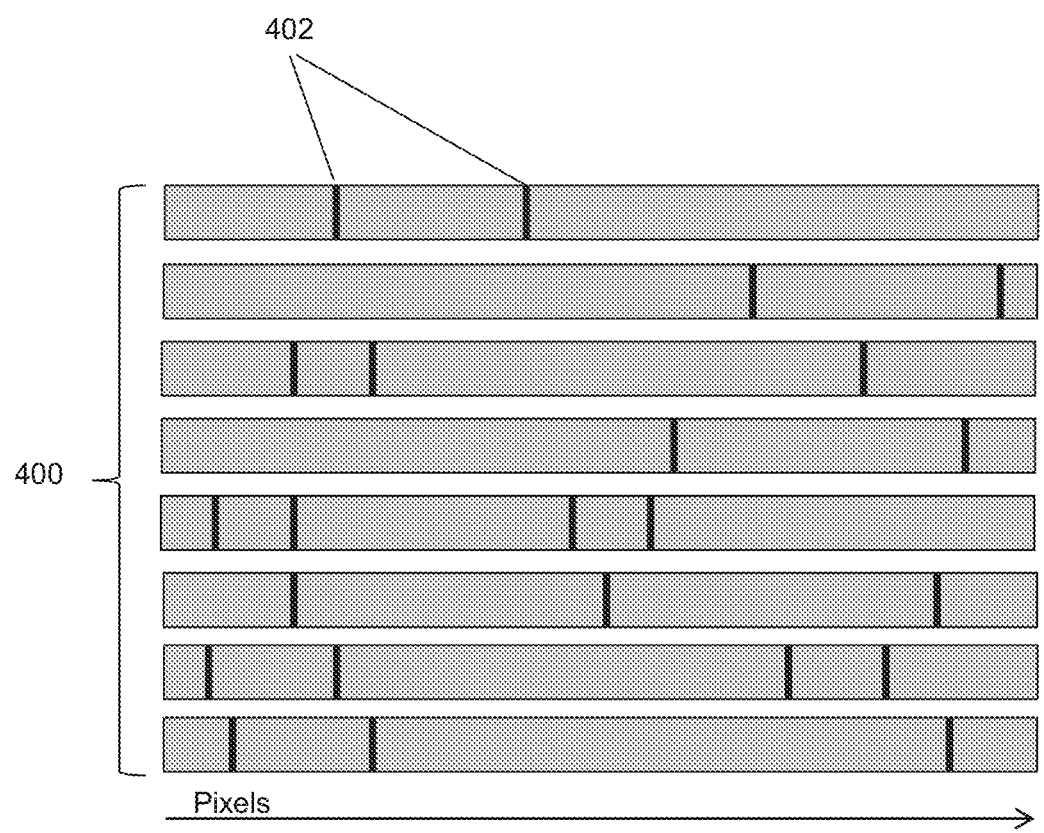
FIG. 4 depicts a schematic representation of a plurality of sets of data comprising known and unknown values.

FIG. 4 shows a schematic representation of a plurality of pupil images 400. The pupil images include pixels 402 that may be indicative of reflectivity or intensity of radiation reflected or diffracted from one or more features in or on a substrate (a stack). It is noted that, in this example, the pixel values in each of the pupil images 400 are concatenated into a single vector. These vectors may be dealt with collectively as a matrix, as shown in FIG. 4. Each of the plurality of pupil images 400 comprises at least one known pixel value 402. The known pixel values 402 may be simulated pixel values determined using the techniques mentioned above and known to the skilled person, pixel values passed from previous processes or a mixture of the two. In the exemplary embodiment shown in FIG. 4, each of the pixel images 400 is a pixel image to be estimated and comprises a plurality of pixels 402 that have been simulated based on Maxwell's equations. Each of the pupil images relates to the same features fabricated in or on the substrate in that they each represent a simulated pupil image that would be expected when radiation is diffracted and/or reflected and/or scattered by those features, although this need not be the case. In exemplary arrangements, one or more of the pupil images in the plurality of pupil images 400 may have been determined based on further features of the or a different substrate. In practice, the smoothness and correlation conditions imposed by methods and apparatuses disclosed herein may be similar for different features. Therefore, pixel values determined for a further set of features may be used in the estimation of pupil images relating to the features on which the metrology is to be undertaken.

Figure 5:
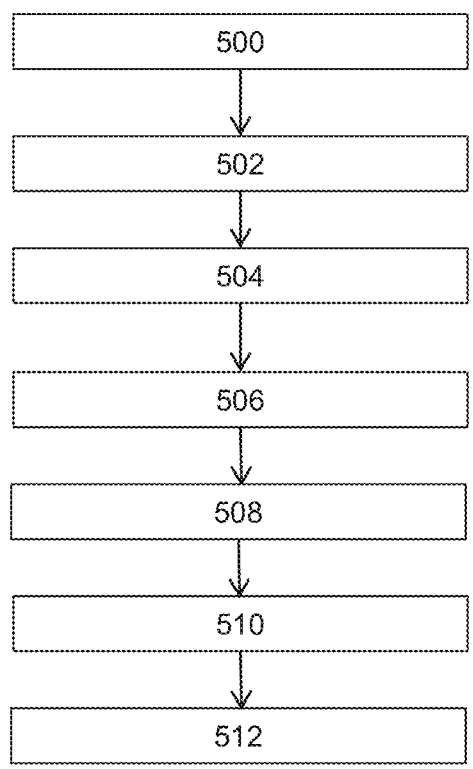
FIG. 5 is a flow diagram showing a method for estimating a plurality of sets of data.

FIG. 5 shows a flow diagram of a method for estimating the pupil images 400. Initially, the smoothness condition and the correlation condition are determined 500. This may be done based on empirical data of a pupil images measured or simulated based on one or more features fabricated in or on a substrate. As discussed previously, the features may correspond to the features on which the metrology is to be undertaken or may correspond to further features.

The smoothness condition may be defined by a difference in magnitude between two pixel values within a pupil image. The lower the difference in magnitude, the higher the smoothness. The smoothness condition may impose a minimum threshold value for smoothness on estimated pixel values of a pupil image. The difference in magnitude may be defined between adjacent pixel values and may relate to a plurality of pairs of adjacent pixel values. It is noted that a set of data may be an abstract reproduction of a 2-D pixel reflectivity structure in the "real" world and "adjacent" may mean "adjacent in the 2-D pixel reflectivity structure. That is, the term adjacent, as used here encompasses pixel values that would be adjacent when the pupil image is formed, which may not be the case when the pupil image is in vector form. Further, the difference in magnitude may be an average difference in magnitude across a plurality of pixels within a pupil image. The smoothness condition may be indicative of information content in the pupil images. In particular, the higher the smoothness, the less high frequency data that is in the pupil image. High frequency data may be indicative of information content.

The correlation condition may be defined as a correlation between pixel values in different pupil images and/or a correlation between pixel values in the same pupil image. The higher the correlation between pixel values, the lower the information content in the pupil images. The correlation condition may impose a maximum threshold value for correlation (or, looked at another way, a minimum threshold value for the information content or rank) on estimated pixel values in a pupil image. More specifically, the correlation condition may be defined as a correlation between corresponding pixel values in different pupil images. The term corresponding as used here encompasses pixel values having the same position in the pupil image when it is formed. The correlation condition may be indicative of an information content in the plurality of pupil images 400. Where the information content in the pupil images 400 is low then the methods and apparatuses disclosed herein may be applied to estimate the pixel values in the pupil images 400 with greater accuracy.

In exemplary arrangements, the smoothness condition and the correlation condition may be imposed jointly. That is, a combination of the smoothness condition and the correlation condition may be imposed. The combination may be a sum of the smoothness condition and the information content associated with the correlation condition. The combination of the smoothness condition and the information content associated with the correlation condition may impose a single combined (or third) condition. In such arrangements, the combined condition may be minimized.

The known pixel values 402 are obtained at 502. This may be achieved by obtaining the known pixel values 402 from a previous process or by simulating the known pixel values 402 using methods known to the skilled person. As can be seen from FIG. 4, each of the pupil images 400 includes some known pixel values 402. In that example, each of the pupil images 400 also includes unknown pixel values.

A matrix completion algorithm is then undertaken at 504 to complete the matrix formed by the vectorized pupil images 400. More specifically, the matrix completion algorithm may use the imposed smoothness condition and/or the imposed correlation condition as regularization in a self-imposed, ill-posed problem that is solved using convex optimization techniques, such as proximal-splitting and primal-dual algorithms.

In one specific example, the matrix completion algorithm may be defined by solving the following optimization task for D, although other definitions of the matrix completion algorithm are possible:

$$\arg\min_{D} \|D\|_* + \gamma \sum_{i=1}^{n} \|d_i\|_{TV} + \iota_{\|D_M - MD\|_2^2 \leq \epsilon^2}(D)$$

wherein D is a matrix of the vectorized stacked pupil images that are to be simulated, represented schematically by 400 in FIG. 4. Each row $d_i$ of the matrix D represents one full pupil image. To perform the approximation, methods and apparatuses disclosed herein are configured to simulate several pixels $D_M$ for each pupil using Maxwell's equations. The pixels $D_M$ may be selected randomly or may be selected based on one or more parameters, such as the location of pixels in the pupil images, or a correlation value across pupil images for particular pixels. The pixels to be simulated are identified via a selection mask M. The above optimization task imposes that a difference between the simulated matrix of pupil images (the known pixel values) and the estimated pixel values has a very small error, given by ε. As regularization, the method imposes that each pupil image has a particular smoothness, e.g. that the difference in magnitude between pixels in each pupil image is below a threshold value or is minimized (i.e. smoothness is maximized). In some exemplary methods and apparatuses, smoothness may be maximized by searching for the smoothest pupil images that also generate the lowest nuclear norm for D with the constraint that the error on the measured data is below ε. Further, the algorithm imposes that the pixels are correlated between pupil images, i.e. the resulting matrix D has a low information content (low rank) and therefore a high correlation between pupil images. The low information condition is relaxed in the form of minimizing the nuclear norm of the matrix D to ensure that the problem is convex.

To solve the optimization problem above and to produce estimated pupil images 400, convex optimization techniques, such as proximal splitting and primal dual methods may be applied. Since the functions employed are non-differentiable, proximal splitting methods can be applied. Such methods could be for example based on forward-backward algorithms, primal-dual algorithms or augmented Lagrangian methods. A further approach is to use smooth approximations to the non-differentiable nuclear and TV norms, replace the data fidelity term with an L2 term, and use gradient/Hessian based first/second order methods.

The imposed first and second conditions, namely the smoothness and correlation conditions, represent a strong knowledge transfer from previously known stack simulations. In exemplary arrangements, a plurality of full pupil image simulations that were performed for many applications comprise the known stack simulations. These may be analyzed to extract one or more properties that are common between the applications, stacks and/or pupil images. The extracted properties may then be used to determine the correlation and smoothness conditions. For all applications encountered thus far, the first and second conditions are satisfied meaning that data from previous processes relating to different stacks may be used.

The estimated pupil images may then be formed at 506 into a library against which measured pupil images may be compared. Exemplary methods and apparatuses may measure at 508 a pupil image by directing radiation onto the one or more features fabricated in or on the substrate and sensing radiation that has been diffracted and/or reflected and/or scattered by the one or more features. The measured pupil image may then be compared at 510 to one or more estimated pupil images in the library and a suitably close match found. Based on the estimated pupil image(s) that most closely matches the measured pupil image, one or more parameters of the one or more features, such as CD, overlay, focus, dose, pitchwalk, etc., may be determined at 512.

Figure 6:
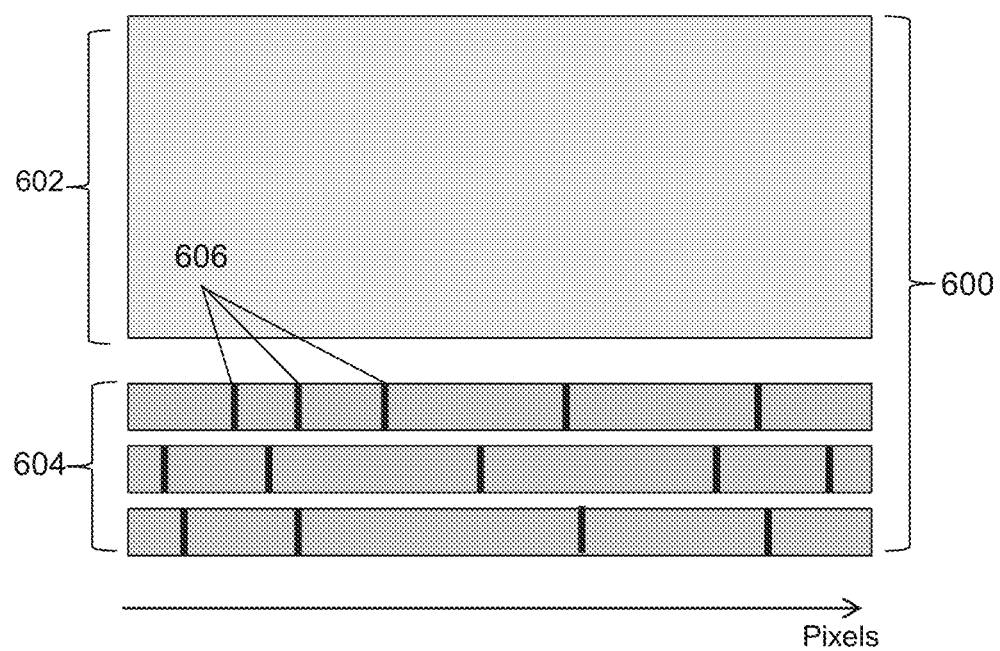
FIG. 6 depicts a schematic representation of a plurality of sets of data comprising known and unknown values.

FIG. 6 shows a further exemplary schematic representation of a plurality of pupil images 600. As with FIG. 4, the pupil images 600 include pixels 606 that may be indicative of reflectivity or intensity of radiation reflected or diffracted from one or more features in or on a substrate (a stack). In the example of FIG. 6, one or more pixels of a first one or more pupil images 602 of the plurality of pupil images 602 is obtained from a previous process. The first one or more pupil images 602 therefore comprise a number of known pixel values and, in the example shown, all of the pixel values of the first one or more pupil images 602 are known, although methods and apparatus may use other percentages of known pixel values, for example at least 50%, at least 75% or at least 90%. Further, in some exemplary arrangements, the first one or more pupil images 602 may include as little as one known pixel value, although this will reduce the accuracy of the estimation of the unknown pixel values. Generally, it can be said that the fewer known pixel values in the first 602 (and second 604—discussed below) pupil images, the less accurate the estimation of the unknown pixel values. The known pixel values of the first one or more pupil images 602 may relate to the one or more features of the substrate on which the metrology will be undertaken. The known pixel values of the first one or more pupil images 602 may relate to one or more features of a substrate that have a similar shape as the one or more features of the substrate on which the metrology will be undertaken. Alternatively, and in the case of FIG. 6, the known pixel values of the first one or more pupil images 602 may relate to other features of the same or a different substrate and which were determined and/or estimated previously. The known pixel values of the first one or more pupil images 602 may be obtained from an existing library of pupil images. The first one or more pupil images 602 are represented as a block or matrix, although it will be understood that the block may comprise a plurality of vectorized pupil images.

A second one or more pupil images 604 are the pupil images to be estimated. The second one or more pupil images 604 comprise known pixel values 606 and unknown pixel values.

In a similar way to that discussed above in respect of FIGS. 4 and 5, the first and second conditions (e.g. smoothness and correlation) may be imposed over the concatenation of the first one or more pupil images 602, which may be known full pupil images from a previous process, and the second one or more pupil images 604 in which only part of the pixel values are known. As mentioned above, the pixel values known from the previous process may relate to the same or a further one or more features.

Figure 7:
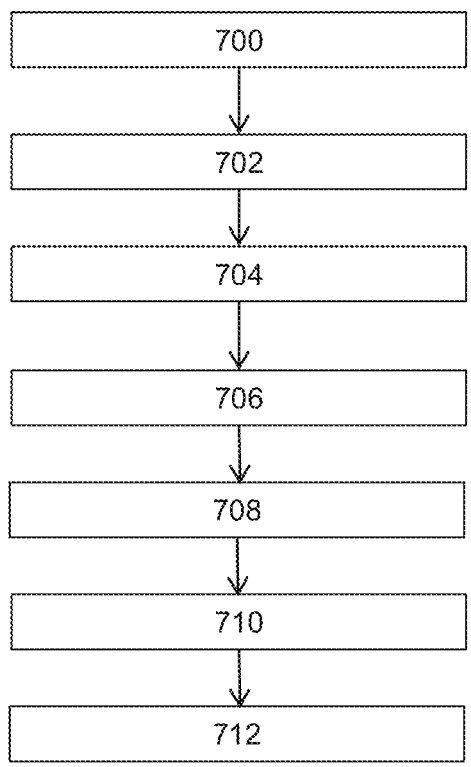
FIG. 7 is a flow diagram showing a method for estimating a plurality of sets of data.

FIG. 7 shows a flow diagram of a method for estimating pupil images 604. A number of the steps of FIG. 7 are the same or similar to those of FIG. 5 and are not explained again in detail here. Initially, the smoothness condition and the correlation condition are determined at 700. The known pixel values of the first 602 and second 604 one or more pupil images are obtained at 702. This may be achieved by obtaining the known pixel values from a previous process, by simulating the known pixel values using methods known to the skilled person or a combination of both. In the example of FIG. 6, the first one or more pupil images 602 are obtained from a previous process and the known pixel values 606 of the second one or more pupil images 604 are simulated. As can be seen from FIG. 6, each of the pupil images 600 includes some known pixel values.

A matrix completion algorithm is then undertaken at 704 to complete a matrix formed by the vectorized pupil images 600. The estimated pupil images may then be formed at 706 into a library against which measured pupil images may be compared. Exemplary methods and apparatus may measure at 708 a pupil image by directing radiation onto the one or more features fabricated in or on the substrate and sensing radiation that has been diffracted and/or reflected and/or scattered by the one or more features. The measured pupil image may then be compared at 710 to estimated pupil images in the library and a suitably close match found. Based on the estimated pupil image or images that most closely match the measured pupil image, one or more parameters of the one or more features, such as CD, overlay, focus, dose and/or pitchwalk, may be determined at 712.

In exemplary methods and apparatus in which known pixel values are generated using a Maxwell solver, one or more strategies for deciding which pixel values in a pupil image to determine may be used. In some exemplary arrangements, more known pixel values may be generated at locations in the pixel image where information content is higher. In some pupil images, this may mean that concentrations of generated known pixel values are higher at a central region and at a peripheral region. A region between the central and peripheral regions may comprise fewer generated known pixel values relative to the central and peripheral regions. In exemplary arrangements, known pixel values may be generated at locations where information content is above a threshold value. Therefore, the concentration of generated known pixel values may be greater at such locations.

Figure 8:
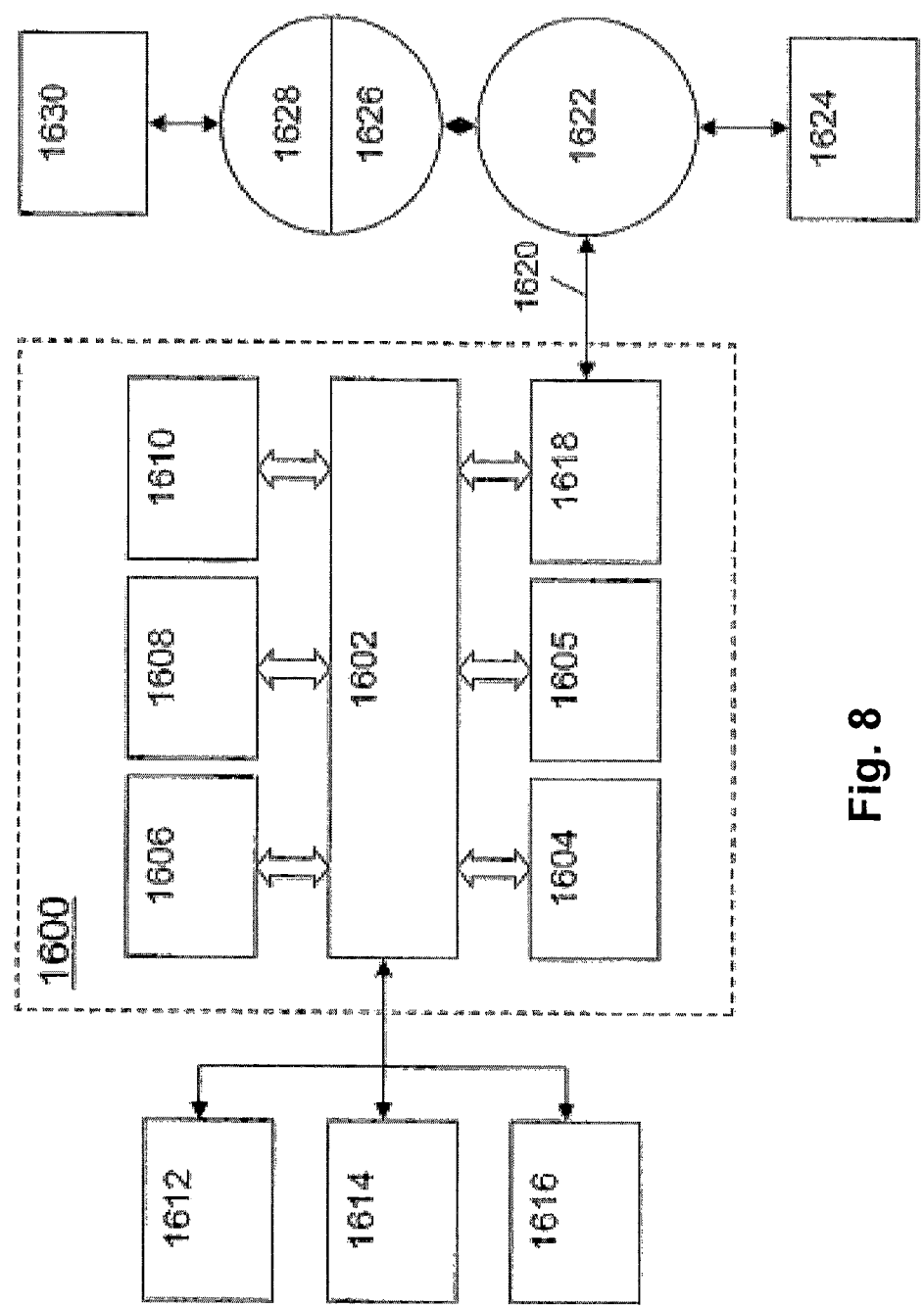
FIG. 8 is a block diagram illustrating a computer system that may assist in implementing methods and flows disclosed herein.

FIG. 8 is a block diagram that illustrates an example computer system 1600 that may assist in implementing all or part of one or more methods and/or flows disclosed herein. Computer system 1600 includes a bus 1602 or other communication mechanism for communicating information, and a processor 1604 (or multiple processors 1604 and 1605) coupled with bus 1602 for processing information. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multi-processing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 may also include a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 may send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

Further embodiments are provided in the subsequent numbered clauses:

1. An apparatus for estimating an unknown value of at least one of a plurality of sets of data, each set of data comprising a plurality of values indicative of radiation diffracted and/or reflected and/or scattered by one or more features fabricated in or on a substrate, wherein the plurality of sets of data comprises at least one known value, and wherein at least one of the plurality of sets of data comprises an unknown value, the apparatus comprising a processor configured to estimate the unknown value of the at least one set of data based on:
   the known values of the plurality of sets of data;
   a first condition between two or more values within a set of data of the plurality of sets of data; and
   a second condition between two or more values being part of different sets of data of the plurality of the sets of data.
2. The apparatus of clause 1, wherein the first condition comprises a smoothness condition.
3. The apparatus of clause 1 or clause 2, wherein the first condition comprises data indicating a difference in magnitude between one or more values within the set of data of the plurality of sets of data.
4. The apparatus of any of clauses 1 to 3, wherein the processor is configured to apply the first condition between two or more values comprising adjacent values within the set of data of the plurality of sets of data.
5. The apparatus of any of clauses 1 to 4, wherein the second condition comprises a correlation condition.
6. The apparatus of any of clauses 1 to 5, wherein the second condition comprises a correlation between corresponding values in the different sets of data of the plurality of the sets of data.
7. The apparatus of clause 6, wherein the correlation condition further comprises a correlation between values in one of the sets of data of the plurality of sets of data.
8. The apparatus of any of clauses 1 to 7, wherein the first condition and/or the second condition is indicative of an information content of the plurality of sets of data.
9. The apparatus of any of clauses 1 to 8, wherein the processor is configured to estimate the unknown value of the at least one set of data based on a matrix completion algorithm.
10. The apparatus of clause 9, wherein the matrix completion algorithm is based on a convex optimization technique.
11. The apparatus of clause 10, wherein the convex optimization technique comprises a proximal splitting algorithm or a primal-dual algorithm.
12. The apparatus of any of clauses 1 to 11, wherein the processor is configured to estimate the unknown value of the at least one set of data based on:

$$\arg\min_D \|D\|_* + \gamma \sum_{i=1}^{n} \|d_i\|_{TV} + \iota_{\|D_M - MD\|_2^2 \le \varepsilon^2}(D)$$

wherein $d_i$ is a set of data and forms a row of a matrix D, $D_M$ is the plurality of known values, $\gamma$ is a value that assigns a weight to the smoothness condition compared to the correlation condition, $\varepsilon$ is an error term in an estimation of known values in D, M is a mask identifying the plurality of known values and TV is the total variation.
13. The apparatus of any of clauses 1 to 12, wherein the processor is configured to estimate unknown values in one or more sets of data for each of a plurality of optical and/or feature parameters and to generate a library of sets of data that is comparable with a measured set of data obtained via a measurement performed by a sensor.
14. The apparatus of clause 13, wherein the processor is configured to match the measured set of data with at least one of the sets of data in the library to determine at least one parameter of a lithographic process undertaken on the substrate.
15. The apparatus of any of clauses 1 to 14, wherein the processor is further configured to generate one or more of the known values in the at least one set of data based on one or more selected from:
   at least one parameter of an optical system configured to direct radiation towards the one or more features fabricated in or on a substrate;
   at least one parameter of the radiation; or
   at least one parameter of the one or more features fabricated in or on a substrate.
16. The apparatus of clause 15, wherein the processor is configured to generate the one or more of the known values at locations in a set of data at which information content is above a threshold value.
17. The apparatus of any of clauses 1 to 16, wherein all values in one or more of the plurality of sets of data are known.
18. The apparatus of clause 17, wherein the one or more sets of data in which all values are known relate to one or more further features fabricated in or on the substrate or in or on a further substrate.
19. The apparatus of any of clauses 1 to 18, wherein one or more of the plurality of sets of data represents a pupil image and one or more of the values represents a pixel of a pupil image.
20. The apparatus of any of clauses 1 to 19, wherein one or more of the pixels comprises data indicative of reflectivity or intensity.
21. The apparatus of any of clauses 1 to 20, further comprising a sensor configured to receive radiation diffracted and/or reflected and/or scattered by the one or more features.
22. An inspection apparatus comprising the apparatus of any of clauses 1 to 21.
23. The inspection apparatus of clause 22, wherein the inspection apparatus is a metrology apparatus.
24. A lithographic apparatus comprising an apparatus according to any of clauses 1 to 21.
25. A lithographic cell comprising an apparatus according to any of clauses 1 to 24.
26. A method for estimating an unknown value of at least one of a plurality of sets of data, each set of data comprising a plurality of values indicative of radiation diffracted and/or reflected and/or scattered by one or more features fabricated in or on a substrate, wherein the plurality of sets of data comprises at least one known value, and wherein at least one of the plurality of sets of data comprises an unknown value, the method comprising:
   estimating, by a processor, the unknown value of the at least one set of data based on:

the known values of the plurality of sets of data;
a first condition between two or more values within a set of data of the plurality of sets of data; and
a second condition between two or more values being part of different sets of data of the plurality of the sets of data.

27. The method of clause 26, wherein the first condition comprises a smoothness condition.
28. The method of clause 26 or clause 27, wherein the first condition comprises data indicating a difference in magnitude between one or more values within the set of data of the plurality of sets of data.
29. The method of any of clauses 26 to 28, further comprising applying the first condition between two or more values comprising adjacent values within the set of data of the plurality of sets of data.
30. The method of any of clauses 26 to 29, wherein the second condition comprises a correlation condition.
31. The method of any of clauses 26 to 30, wherein the second condition comprises a correlation between corresponding values in the different sets of data of the plurality of the sets of data.
32. The method of clause 31, wherein the correlation condition further comprises a correlation between values in one of the sets of data of the plurality of sets of data.
33. The method of any of clauses 26 to 32, wherein the first condition and/or the second condition is indicative of an information content of the plurality of sets of data.
34. The method of any of clauses 26 to 33, further comprising estimating the unknown value of the at least one set of data based on a matrix completion algorithm.
35. The method of clause 34, wherein the matrix completion algorithm is based on a convex optimization technique.
36. The method of clause 35, wherein the convex optimization technique comprises a proximal splitting algorithm or a primal-dual algorithm.
37. The method of any of clauses 26 to 36, further comprising estimating the unknown value of the at least one set of data based on:

$$\arg\min_D \|D\|_* + \gamma \sum_{i=1}^{n} \|d_i\|_{TV} + \iota_{\|D_M - MD\|_2^2 \leq \varepsilon^2}(D)$$

wherein $d_i$ is a set of data and forms a row of a matrix D, $D_M$ is the plurality of known values, $\gamma$ is a value that assigns a weight to the smoothness condition compared to the correlation condition, $\varepsilon$ is an error term in an estimation of known values in D, M is a mask identifying the plurality of known values and TV is the total variation.

38. The method of any of clauses 26 to 37, further comprising estimating unknown values in one or more sets of data for each of a plurality of optical and/or feature parameters and to generate a library of sets of data that is comparable with a measured set of data obtained via a measurement performed by a sensor.
39. The method of clause 38, further comprising matching the measured set of data with at least one of the sets of data in the library to determine at least one parameter of a lithographic process undertaken on the substrate.
40. The method of any of clauses 26 to 39, further comprising generating one or more of the known values in the at least one set of data based on one or more selected from:
    at least one parameter of an optical system configured to direct radiation towards the one or more features fabricated in or on a substrate;
    at least one parameter of the radiation; or
    at least one parameter of the one or more features fabricated in or on a substrate.
41. The method of clause 40, further comprising generating the one or more of the known values at locations in a set of data at which information content is above a threshold value.
42. The method of any of clauses 26 to 41, wherein all values in one or more of the plurality of sets of data are known.
43. The method of clause 42, wherein the one or more sets of data in which all values are known relate to one or more further features fabricated in or on the substrate or in or on a further substrate.
44. The method of any of clauses 26 to 43, wherein one or more of the plurality of sets of data represents a pupil image and one or more of the values represents a pixel of a pupil image.
45. The method of any of clauses 26 to 44, wherein one or more of the pixels comprises data indicative of reflectivity or intensity.
46. A computer program comprising instructions which, when executed on at least one processor, cause the at least one processor to control an apparatus to carry out the method according to any of clauses 26 to 45.
47. A carrier containing the computer program of clause 46, wherein the carrier is an electronic signal, an optical signal, a radio signal, or a non-transitory computer readable storage medium.

Although specific reference may be made in this text to embodiments of the invention in the context of various apparatus, embodiments of the invention may be used in one or more various apparatuses. Embodiments of the invention may form part of or be used with a lithographic apparatus, a patterning device inspection apparatus, an inspection or metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus configured to produce simulated values indicative of radiation diffracted and/or reflected and/or scattered by one or more features fabricated in or on a substrate, wherein each set of data of a plurality of sets of data comprises a plurality of values indicative of radiation diffracted and/or reflected and/or scattered by one or more features fabricated in or on a substrate, wherein the plurality of sets of data comprises at least one known value indicative of radiation diffracted and/or reflected and/or scattered by one or more features fabricated in or on a substrate, and wherein at least one of the plurality of sets of data comprises an unknown value indicative of radiation diffracted and/or reflected and/or scattered by one or more features fabricated in or on a substrate, the apparatus comprising:
a processor configured to produce a simulated estimate of the unknown value of the at least one set of data based on:
the known values of the plurality of sets of data;
a first condition between two or more values within a set of data of the plurality of sets of data; and
a second condition between two or more values being part of different sets of data of the plurality of sets of data.

2. The apparatus of claim 1, wherein the first condition comprises a smoothness condition.

3. The apparatus of claim 1, wherein the first condition comprises data indicating a difference in magnitude between one or more values within a set of data of the plurality of sets of data.

4. The apparatus of claim 1, wherein the second condition comprises a correlation condition.

5. The apparatus of claim 1, wherein the second condition comprises a correlation between corresponding values in different sets of data of the plurality of sets of data.

6. The apparatus of claim 5, wherein the correlation further comprises a correlation between values in one of the sets of data of the plurality of sets of data.

7. The apparatus of claim 1, wherein the processor is configured to estimate the unknown value of the at least one set of data based on a matrix completion algorithm.

8. The apparatus of claim 7, wherein the matrix completion algorithm is based on a convex optimization technique.

9. The apparatus of claim 8, wherein the convex optimization technique comprises a proximal splitting algorithm or a primal-dual algorithm.

10. The apparatus of claim 1, wherein the processor is configured to produce the simulated estimate of the unknown value of the at least one set of data based on:

$$\arg\min_D \|D\|_* + \gamma \sum_{i=1}^{n} \|d_i\|_{TV} + \iota_{\|D_M - MD\|_2^2 \le \epsilon^2}(D)$$

wherein $d_i$ is a set of data and forms a row of a matrix D, $D_M$ is the plurality of known values, $\gamma$ is a value that assigns a weight to a smoothness condition compared to a correlation condition, $\epsilon$ is an error term in an estimation of known values in D, M is a mask identifying the plurality of known values and TV is the total variation.

11. The apparatus of claim 1, wherein the processor is configured to produce a simulated estimate of unknown values in one or more sets of data for each of a plurality of optical and/or feature parameters and to generate a library of sets of data that is comparable with a measured set of data obtained via a measurement performed by a sensor.

12. The apparatus of claim 11, wherein the processor is configured to match the measured set of data with at least one of the sets of data in the library to determine at least one parameter of a lithographic process undertaken on the substrate.

13. The apparatus of claim 1, wherein the processor is further configured to generate one or more of the known values in the at least one set of data based on one or more selected from:
at least one parameter of an optical system configured to direct radiation towards the one or more features fabricated in or on a substrate;
at least one parameter of the radiation; and/or
at least one parameter of the one or more features fabricated in or on a substrate.

14. The method of claim 13, wherein the processor is further configured to generate the one or more of the known values at locations in a set of data at which information content is above a threshold value.

15. The apparatus of claim 1, wherein all values in one or more of the plurality of sets of data are known.

16. The apparatus of claim 1, wherein one or more of the plurality of sets of data represents a pupil image and one or more of the values represents a pixel of a pupil image.

17. The apparatus of claim 16, wherein one or more of the pixels comprises data indicative of reflectivity or intensity.

18. A lithographic apparatus comprising:
a pattern transfer apparatus to transfer a pattern onto a substrate; and
the apparatus according to claim 1.

19. A method for producing simulated values indicative of radiation diffracted and/or reflected and/or scattered by one or more features fabricated in or on a substrate, wherein each set of data of of a plurality of sets of data comprises a plurality of values indicative of radiation diffracted and/or reflected and/or scattered by one or more features fabricated in or on a substrate, wherein the plurality of sets of data comprises at least one known value indicative of radiation diffracted and/or reflected and/or scattered by one or more features fabricated in or on a substrate, and wherein at least one of the plurality of sets of data comprises an unknown value indicative of radiation diffracted and/or reflected and/or scattered by one or more features fabricated in or on a substrate, the method comprising:
producing a simulated estimate, by a hardware processor system, of the unknown value of the at least one set of data based on:
the known values of the plurality of sets of data;
a first condition between two or more values within a set of data of the plurality of sets of data; and
a second condition between two or more values being part of different sets of data of the plurality of sets of data.

20. A non-transitory computer program product comprising instructions therein which, when executed on a processor system, cause the processor system to at least:

produce a simulated estimate of an unknown value indicative of radiation diffracted and/or reflected and/or scattered by one or more features fabricated in or on a substrate of at least one of a plurality of sets of data, wherein each set of data of the plurality of sets of data comprises a plurality of values indicative of radiation diffracted and/or reflected and/or scattered by one or more features fabricated in or on a substrate, wherein the plurality of sets of data comprises at least one known value indicative of radiation diffracted and/or reflected and/or scattered by one or more features fabricated in or on a substrate, and wherein the production of the simulated estimate of the unknown value of the at least one set of data is based on:

the known values of the plurality of sets of data;

a first condition between two or more values within a set of data of the plurality of sets of data; and a second condition between two or more values being part of different sets of data of the plurality of sets of data.

* * * * *